US006563854B2

(12) United States Patent
Tedesco

(10) Patent No.: US 6,563,854 B2
(45) Date of Patent: May 13, 2003

(54) INTEGRATED EXTERNAL DIODE LASER MODULE PARTICULARLY SUITED TO RAMAN SPECTROSCOPY

(75) Inventor: James M. Tedesco, Livonia, MI (US)

(73) Assignee: Kaiser Optical Systems, Ann Arbor, MI (US)

( * ) Notice: Subject to any disclaimer, the term of this patent is extended or adjusted under 35 U.S.C. 154(b) by 100 days.

(21) Appl. No.: 09/855,055

(22) Filed: May 14, 2001

(65) Prior Publication Data

US 2002/0031163 A1 Mar. 14, 2002

Related U.S. Application Data

(60) Provisional application No. 60/203,970, filed on May 12, 2000.

(51) Int. Cl.[7] .............................................. H01S 3/08
(52) U.S. Cl. ........................ 372/102; 372/20; 356/301; 356/328
(58) Field of Search ........................... 372/102, 20, 98, 372/92; 356/301, 328; 385/37; 359/334

(56) References Cited

U.S. PATENT DOCUMENTS

| | | | |
|---|---|---|---|
| 5,881,197 A | * 3/1999 | Dong et al. | 385/127 |
| 6,038,239 A | * 3/2000 | Gabbert | 372/20 |
| 6,100,975 A | * 8/2000 | Smith et al. | 356/301 |
| 6,373,567 B1 | * 4/2002 | Wise et al. | 356/301 |
| 6,456,756 B1 | * 9/2002 | Mead et al. | 385/37 |

* cited by examiner

Primary Examiner—Albert W. Paladini
(74) Attorney, Agent, or Firm—Gifford, Krass, Groh, Sprinkle, Anderson & Citkowski, PC

(57) ABSTRACT

An external cavity diode laser system which finds utility in many application areas, is particularly suited to fiber-coupled Raman Spectroscopy. A holographic transmission grating is disposed in the optical path to transmit elements of the beam having the nominal wavelength and reject beam elements of differing wavelengths. In a fiber-coupled arrangement, the lens used for focusing the exit beam from the module onto the entrance of the fiber acts as a spatial filter of the light dispersed by the transmission grating. In this configuration, the combination of the transmission grating and the focusing of the exit beam operates as a bandpass filter. The transmission grating is preferably oriented such that the elements of differing wavelengths are dispersed perpendicular to the long dimension of the diode. The module may further include a half-wave retarder supported between the external cavity and transmission gratings to rotate TM polarization orientations to TE polarization orientations. An optical isolator may be disposed in the optical path prior to the exit beam to control spurious reflection, and an optical sensor, preferably supported to receive weak reflections from the transmission grating, may be used to provide an optical power stabilizing feedback to the laser diode source.

11 Claims, 5 Drawing Sheets

INTEGRATED EXTERNAL DIODE LASER MODULE PARTICULARLY SUITED TO RAMAN SPECTROSCOPY

REFERENCE TO RELATED APPLICATION

This application claims priority from U.S. provisional patent application Serial No. 60/203,970, filed May 12, 2000, the entire contents of which is incorporated hereby in by reference.

FIELD OF THE INVENTION

This invention related generally to systems used to characterize materials through optical analysis and, in particular, to an integrated, external cavity diode laser module applicable to Raman, fluorescence and other forms of stimulated emission.

BACKGROUND OF THE INVENTION

In Raman spectroscopy, coherent light directed on a sample is scattered at a number of discrete frequencies above and below that of the incident radiation. The wavelength shifts of the Raman lines, their intensity, and their polarization are characteristics of the scattering substance. The net effect is that the wavelengths of the Raman spectrum for any given material will have a predetermined difference from the wavelength of the incident light. That is, if a Raman spectrum is measured with one wavelength of incident light, and then measured a second time using a different wavelength of incident light, the same Raman wavelength line pattern will be measured, but shifted in wavelength. The number of Raman lines and their wavelength shifts from the incident wavelength remain constant. Raman scattering is similar to fluorescence except for the nature of the energy-level transitions involved.

Raman spectroscopy has proven to be very useful in characterizing the molecular content of unknown materials in chemical, medical, and other industrial and academic applications. A typical high sensitivity Raman system includes a laser which is focused on a sample cell. The Raman scattered light is collected by a lens, polarized, filtered, focused and dispersed by one or more gratings to separate the light into its characteristic spectrum.

The high-cost items in this typical package include the laser (i.e., argon-ion or helium-neon), the collection lens, and certain components associated with detection. All devices must exhibit the sensitivity required to measure Raman line intensities which are typically several orders or magnitude below that of the incident light.

To lower system cost and size, it would be advantageous to use a laser diode as opposed to a more expensive gas laser. Laser diodes with adequate power output are now available, however, they tend to oscillate in several modes (frequencies) and are therefore unsuitable for Raman spectroscopy. FIG. 2A, for example, shows the output of a free-running, 1-Watt, 808-nm diode laser at temperatures and times without stabilization.

In a typical laser diode laser, frequency is entirely dependent on the band gap which, in turn, is dependent on injection current and the temperature of the device. Changes to either often lead to changes in wavelength. To stabilize temperature in spectroscopic applications, a diode laser is therefore used with a thermoelectric cooler. However, the change in band gap with temperature is often subject to hysteresis, such that reproducing a set of operating conditions does not necessarily reproduce the same wavelength. Under such conditions, acquired Raman spectra will exhibit an apparent shift when compared to previously acquired spectra at the same temperature.

Another problem is that spurious radiation from the spectrographic system may be reflected back into the laser diode, which can result in "mode hopping." in which the main laser output frequency hops from one mode to another. Particularly as the current level is changed to increase or decrease the optical power output, regions of instability are encountered causing the laser wavelength to shift, emit multiple wavelengths, or even oscillate between wavelengths in an uncontrolled manner. "Mode hops" can also be caused by optical feedback from various optical elements comprising the system, including collimating optics, pigtails, and so forth. Again, even if a region of stability is found, there is no guarantee that the device will remain stable over time.

Given these circumstances, laser diodes must be stabilized to suppress side-mode oscillation and mode hopping before they can be used in certain industrial applications, including spectroscopy. A recent improvement is the use of an external cavity in conjunction with a diode laser. In such an arrangement, an external grating is used to provide selective feedback to the active region so that lasing only occurs at one wavelength. Unwanted wavelengths are dispersed outside of the cavity by the grating. The selective feedback also eliminates hysteresis and mode hopping.

SUMMARY OF THE INVENTION

This invention resides in an external cavity diode laser system. Although the invention finds utility in many application areas, the package is intended and optimized for use in fiber-coupled Raman Spectroscopy.

The laser diode is coupled to an optical grating forming an external cavity configuration outputting a beam of light having a nominal wavelength along an optical path. Important to the invention, a holographic bandpass filter is disposed in the optical path to transmit elements of the beam having the nominal wavelength and reject beam elements of differing wavelengths.

The bandpass filter includes a transmission grating having first and second sides supported so that the beam intersects the first side at an angle thereto so as to disperse the various wavelengths of the beam through angles which are a function of their wavelength, and one or more optical elements supported in relation to the second side of the holographic transmission grating for forming an exit beam of narrow-band light at the nominal wavelength while rejecting dispersed light of a wavelength differing from the nominal wavelength. In a fiber-coupled arrangement, a lens is used for focusing the exit beam from the module onto the entrance of the fiber. In this configuration, the combination of the transmission grating and the focusing of the exit beam operates as the bandpass filter.

The laser diode has a long dimension and, in the preferred embodiment, the transmission grating is oriented such that the elements of differing wavelengths are dispersed perpendicular to the long dimension of the diode. The module may further include a half-wave retarder supported between the external cavity and transmission gratings to rotate TM polarization orientations to TE polarization orientations.

An optical isolator may be disposed in the optical path prior to the exit beam to control spurious reflection, and an optical sensor, preferably supported to receive weak reflections from the transmission grating, may be used to provide an optical power stabilizing feedback to the laser diode source.

DETAILED DESCRIPTION OF THE INVENTION

This invention resides in an integrated laser diode package particularly suited and optimized for use in fiber-coupled Raman Spectroscopy. However, the system finds utility in various other applications requiring low cost and high stability. For example, the laser output may be used in direct coupled Raman as well, particularly for "line imaging" in a Raman microscope, due to the fact that the multiple spatial mode beam focuses to a line rather than point image.

Figure 1A:
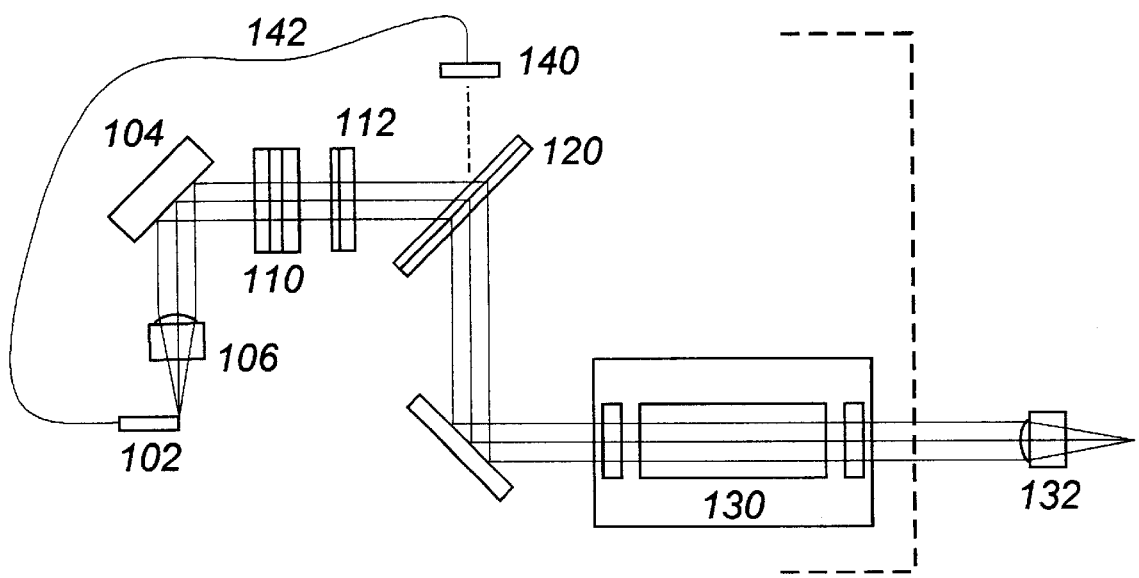
FIG. 1A is a side view of an integrated laser module according to the invention.
Figure 1B:
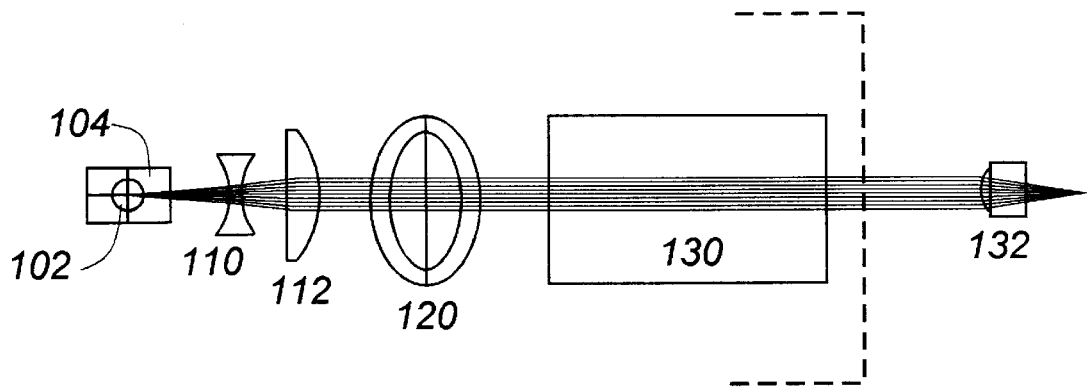
FIG. 1B is a top view of the integrated laser module.

A schematic layout of the laser module is depicted in FIGS. 1A (side view) and 1B (top view). The module preferably uses a standard, broad area (50 microns or wider emitting aperture), long life, multimode diode 102 for greater durability at high power. Lower-power single mode diodes may alternatively be used. No special AR coatings are used, since it has been shown that such coatings are a major source of diode failure in external cavity lasers at both high and low power. They also drive the cost significantly higher than that of "stock" diodes.

Although an AR coating may not be necessary, lower reflectivity designs may perform better than high reflectivity designs. A suitable diode is available from High Power Devices. Although not "AR Coated" in the usual sense, it has an unusually low reflectivity on the standard front facet coating of about 2.5%. This allows the external cavity grating reflections to more easily dominate the free running modes of a lower R diode facet than those from a higher R diode facet. Some diode manufacturers use a coating reflectivity closer to 8%. It has been determined, however, that such devices is much more sensitive to exact alignment, likely due to the use of a higher facet reflectivity.

In terms of the external cavity configuration, the front surface conventional reflective grating 104 is placed as close as possible to the collimating lens 106 in the Littrow configuration. This keeps the cavity "short" and allows the diode to be stabilized without a special low-reflectivity AR coating the front diode facet.

A cylindrical telescope including a negative cylinder 110 and positive cylinder 112 is used to expand the beam in the plane of the wide dimension of the broad area diode (100 micron in our product), to reduce beam divergence due to "large" 100 micron "object" size to the short focal length (~4.25 mm) collimating lens. In a preferred configuration the ~25 mrad divergence is reduced to –8 mrad using a ~3:1 cylindrical beam expansion. This keeps the beam size manageable within the rest of the optical path (steering, bandpass filtering, isolation, focusing into fiber). It also demagnifies the diode image at the fiber, resulting in better coupling efficiency into smaller fibers. This approach also reduces beam divergence while generating a more symmetrical beam cross section with laser diodes.

Figure 3:
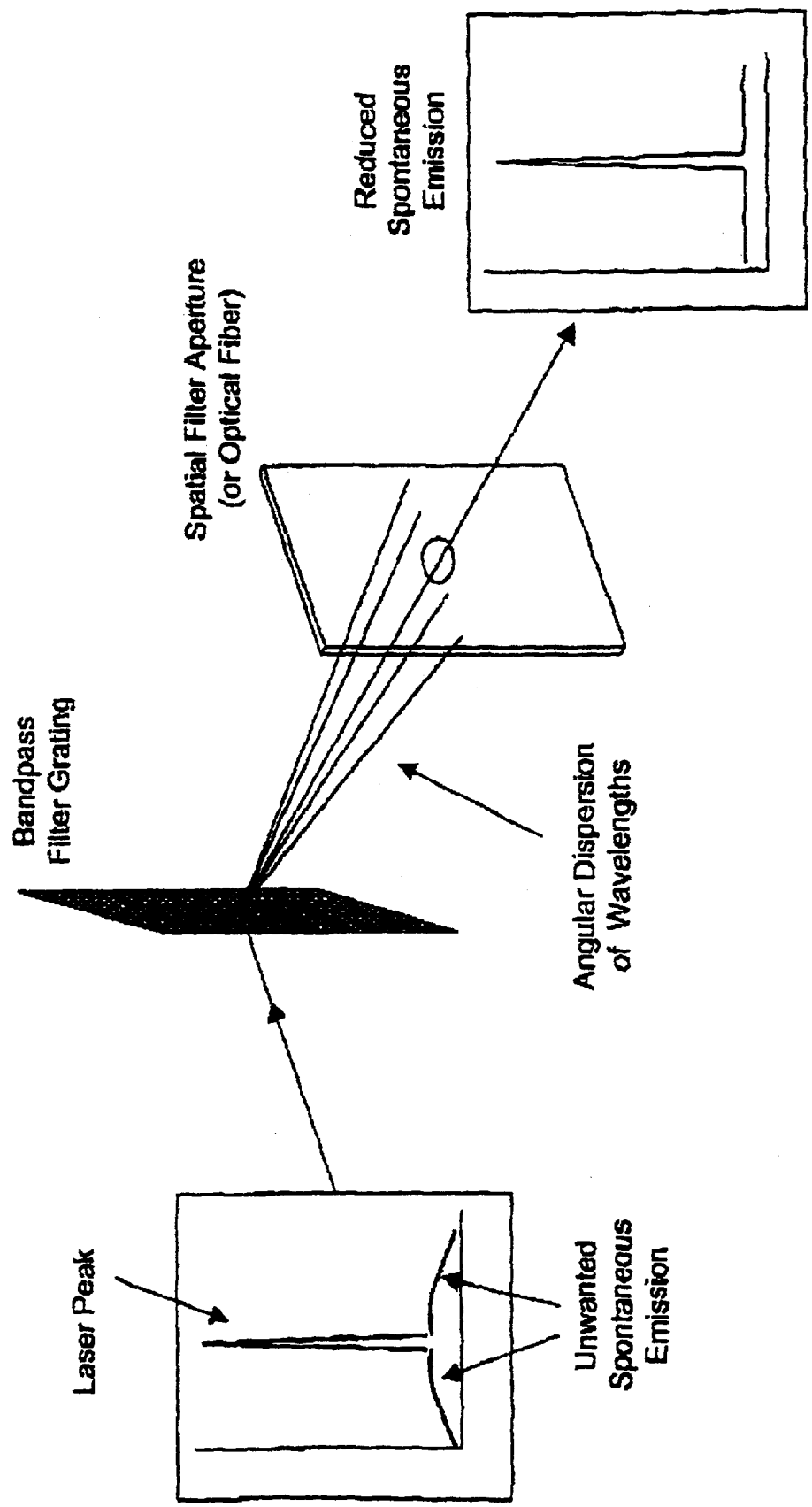
FIG. 3 is a schematic drawing illustrating a built-in laser bandpass filter used to reduce spontaneous emission.

In the preferred embodiment, a holographic bandpass filter 120 is used to greatly reject the diode's wideband spontaneous emission levels from being focused into the fiber. The operation of the filter is shown in FIG. 3 and described in commonly assigned U.S. Pat. No. 5,530,565, the contents of which are incorporated herein by reference.

Figure 4:
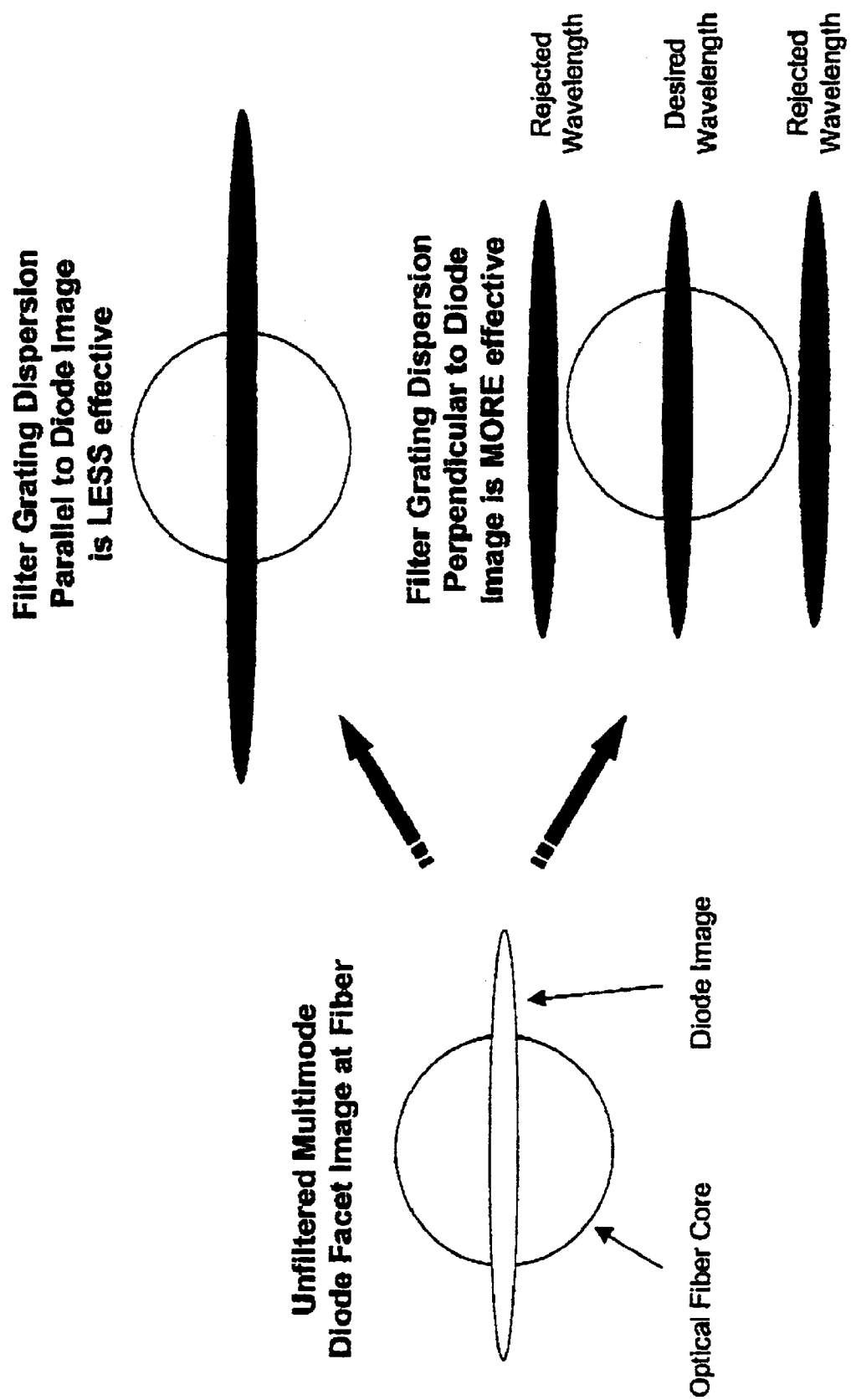
FIG. 4 is a drawing which shows the way in which the bandpass filter is oriented to achieve a desired output wavelength.

In the preferred embodiment, the bandpass filter grating is oriented such that the spontaneous emission wavelengths are dispersed perpendicular to the long dimension of the diode, rather than parallel. This allows much more spontaneous emission to be removed closer to the laser peak wavelength upon focusing into the fiber. It also happens to be the orientation at which the volume phase transmission grating diffracts most efficiently (>90%) for standard TE polarized diodes (such as those we use in the current product, manufactured by High Power Devices). FIG. 4 is a schematic of filter-dispersed diode image at fiber input in the two polarizations. Note that the filter grating dispersion perpendicular to the diode image is more effective in centering the desired wavelength while rejecting unwanted wavelengths, as show at right/bottom.

Figure 2B:
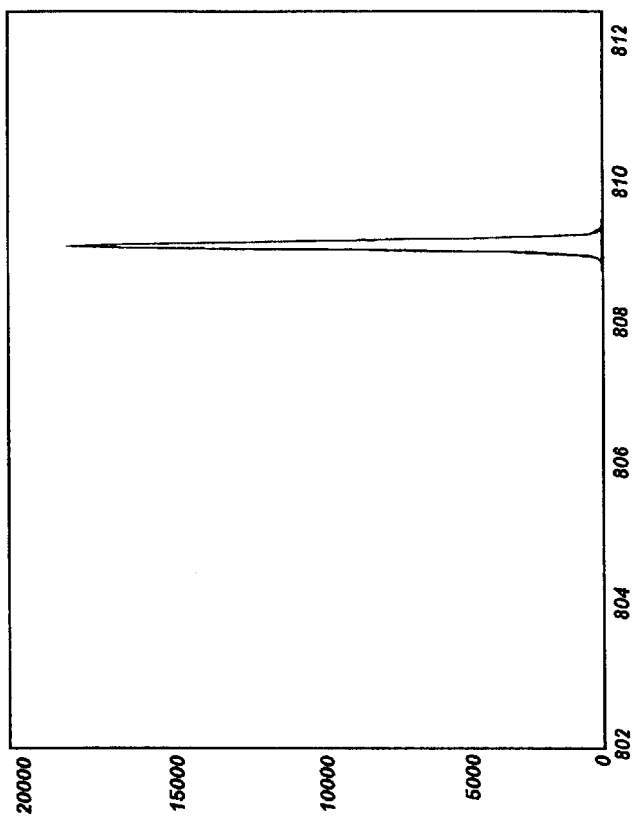
FIG. 2B is a graphic which shows the output of the diode of FIG. 2A having been stabilized according to the invention.
Figure 2A:
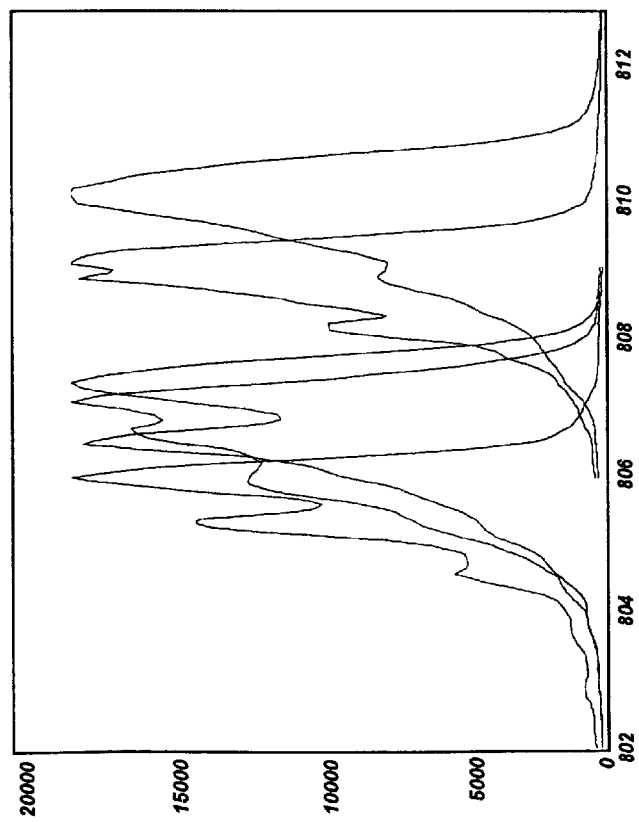
FIG. 2A a graph which shows the output of a free-running one-watt, 808-nm diode at diffrent times and temperatures (15°–25° C.)
Figure 5:
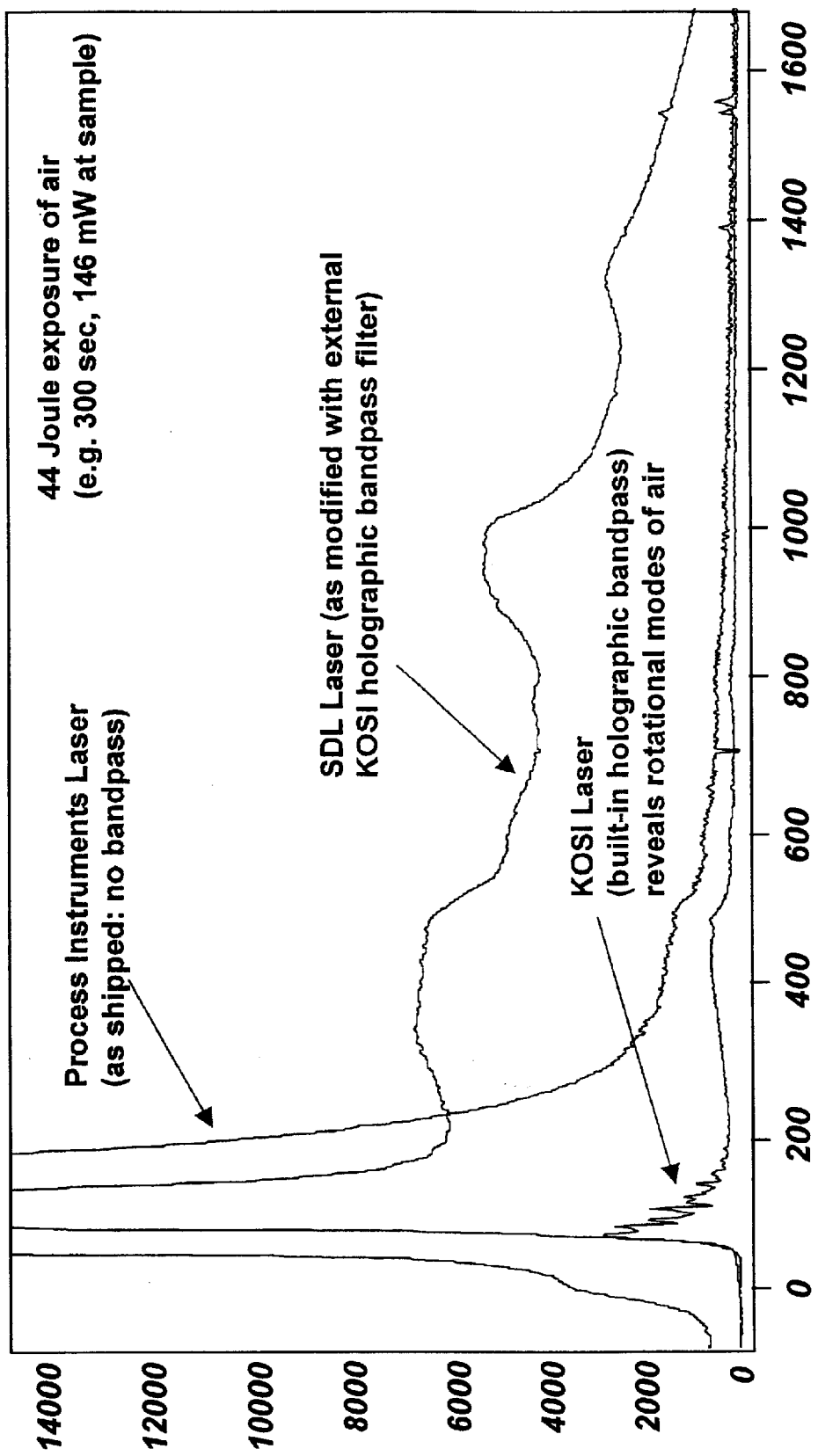
FIG. 5 is a graphic which shows low background emission Raman performance achievable through the use of the inventive laser module.

The invention may accommodate more unique TM polarized diodes (such as those made by Coherent in this wavelength range) through the use of a half-wave retarder positioned between the diode and bandpass grating to rotate the TM polarization to TE for efficient diffraction by the grating and proper orientation of the dispersed emissions for maximum rejection at the fiber. FIG. 2B is a graph which shows the output of a laser constructed in accordance with the invention. FIG. 5 shows a Raman spectrum of air as measured with our laser vs. standard unfiltered Process Instruments laser vs. externally filtered SDL laser.

A built-in optical isolator 130 is also placed in-line before the beam exits the package and is focused by lens 132 into the fiber or onto a sample. This is an added expense and is not necessary in some applications. However, certain external cavity diode lasers have been shown to have much higher failure rates without such isolation when the light is focused into a fiber or onto a reflective object. Such focusing causes reflected light from the fiber or sample to image directly back to the diode facet, which can either directly damage the diode (AR coating) or cause wavelength instability, as discussed above. The use of an isolator attenuates reflected light before it gets back to the diode.

A photodiode sensor 140 is also optionally used in the path of the weak reflection from the glass surface of the bandpass filter grating to provide optical power stabilizing feedback 142 to the diode current driver. Although this is not unique in concept, this particular placement of the sensor precludes the need for a separate beam pickoff element. This is also not an essential feature of the design, since the system can be set to run in constant current mode, not using the photodiode signal at all. In this case, the laser power gradually declines as the diode ages. With the photodiode feedback, the diode aging can be compensated by a gradual increase in drive current.

I claim:

1. An integrated laser module suited to Raman spectroscopy and other applications, comprising:

a laser diode coupled to an optical grating forming an external cavity configuration outputting a beam of light having a nominal wavelength along an optical path; and a holographic bandpass filter disposed in the optical path to transmit elements of the beam having the nominal wavelength and reject beam elements of differing wavelengths, the bandpass filter including:

a transmission grating having first and second sides supported so that the beam intersects the first side at an angle thereto so as to disperse the various wavelengths of the beam through angles which are a function of their wavelength, and one or more optical elements supported in relation to the second side of the holographic transmission grating for forming an exit beam of narrowband light at the nominal wavelength while rejecting dispersed light of a wavelength differing from the nominal wavelength.

2. The integrated laser module of claim 1, wherein:

the exit beam is coupled to an optical fiber; and the optical elements for forming an exit beam of narrowband light includes a lens for focusing the exit beam onto the entrance of the fiber.

3. The integrated laser module of claim 1, wherein:

the laser diode has a long dimension; and the transmission grating is oriented such that the elements of differing wavelengths are dispersed perpendicular to the long dimension of the diode.

4. The integrated laser module of claim 1, further including a half-wave retarder supported between the external cavity and transmission gratings to rotate TM polarization orientations to TE polarization orientations.

5. The integrated laser module of claim 1, further including an optical isolator disposed in the optical path prior to the exit beam.

6. The integrated laser module of claim 1, further including an optical sensor supported to receive weak reflections from the transmission grating to provide an optical power stabilizing feedback to the laser diode source.

7. An integrated laser module coupling light to an optical fiber for Raman spectroscopy and other applications, comprising:

a laser diode coupled to an optical grating forming an external cavity configuration outputting a beam of light having a nominal wavelength along an optical path;

a holographic transmission grating having first and second sides supported so that the beam intersects the first side at an angle thereto so as to disperse the various wavelengths of the beam through angles which are a function of their wavelength; and a lens for focusing the exit beam from the module onto the entrance of the fiber, the combination of the transmission grating and focusing of the exit beam operating as a bandpass filter to form an exit beam of narrowband light at the nominal wavelength while rejecting dispersed light of a wavelengths differing from the nominal wavelength.

8. The integrated laser module of claim 7, wherein:

the laser diode has a long dimension; and the transmission grating is oriented such that the elements of differing wavelengths are dispersed perpendicular to the long dimension of the diode.

9. The integrated laser module of claim 7, further including a half-wave retarder supported between the external cavity and transmission gratings to rotate TM polarization orientations to TE polarization orientations.

10. The integrated laser module of claim 7, further including an optical isolator disposed in the optical path prior to the exit beam.

11. The integrated laser module of claim 7, further including an optical sensor supported to receive weak reflections from the transmission grating to provide an optical power stabilizing feedback to the laser diode source.

* * * * *